(12) United States Patent
Kim et al.

(10) Patent No.: US 10,685,913 B2
(45) Date of Patent: Jun. 16, 2020

(54) E-FUSE FOR USE IN SEMICONDUCTOR DEVICE

(71) Applicants: SK hynix Inc., Gyeonggi-do (KR); INDUSTRY-ACADEMIA COOPERATION GROUP OF SEJONG UNIVERSITY, Seoul (KR)

(72) Inventors: Deok-kee Kim, Seoul (KR); Jae Hong Kim, Gyeonggi-do (KR); Seo Woo Nam, Gyeonggi-do (KR)

(73) Assignees: SK hynix Inc., Gyeonggi-do (KR); INDUSTRY-ACADEMIA COOPERATION GROUP OF SEJONG UNIVERSITY, Seoul (KR)

( * ) Notice: Subject to any disclaimer, the term of this patent is extended or adjusted under 35 U.S.C. 154(b) by 80 days.

(21) Appl. No.: 15/896,771

(22) Filed: Feb. 14, 2018

(65) Prior Publication Data

US 2019/0088597 A1    Mar. 21, 2019

(30) Foreign Application Priority Data

Sep. 18, 2017   (KR) .................. 10-2017-0119315

(51) Int. Cl.
H01L 23/525 (2006.01)

(52) U.S. Cl.
CPC .................. *H01L 23/5256* (2013.01)

(58) Field of Classification Search
None
See application file for complete search history.

(56) References Cited

U.S. PATENT DOCUMENTS

| 2009/0021338 | A1* | 1/2009 | Kim | ............ G11C 17/16 337/227 |
| 2011/0272764 | A1* | 11/2011 | Kim | ............ H01L 23/5252 257/368 |
| 2019/0088596 | A1* | 3/2019 | Kim | ............ H01L 23/5256 |
| 2019/0088646 | A1* | 3/2019 | Kim | ............ H01L 27/0738 |
| 2019/0088647 | A1* | 3/2019 | Kim | ............ H01L 27/0738 |

FOREIGN PATENT DOCUMENTS

| KR | 1020140117907 | 10/2014 |
| KR | 101561650 | 10/2015 |
| KR | 1020160068212 | 6/2016 |

* cited by examiner

*Primary Examiner* — Steven B Gauthier
(74) *Attorney, Agent, or Firm* — IP & T Group LLP

(57) ABSTRACT

An e-fuse for use in a semiconductor device includes first and second electrodes; a gate metal coupling the first and second electrodes with each other; a first oxide layer formed under the gate metal; and a gate oxide layer formed between a bottom end of the gate metal and a top end of the first oxide layer.

7 Claims, 5 Drawing Sheets

E-FUSE FOR USE IN SEMICONDUCTOR DEVICE

CROSS-REFERENCES TO RELATED APPLICATION

The present application claims priority under 35 U.S.C. § 119(a) to Korean application number 10-2017-0119315, filed on Sep. 18, 2017, in the Korean Intellectual Property Office, which is incorporated herein by reference in its entirety.

BACKGROUND

1. Technical Field

Various embodiments generally relate to an e-fuse for use in a semiconductor device, and to a semiconductor device comprising the same.

2. Related Art

In general, semiconductor device fuses are used to achieve various purposes in the field of semiconductor technology. For example, fuses may be used in a repair process in which a failed memory cell is replaced with a redundancy memory cell, and may be used in a constant voltage generation circuit which tunes a voltage or a control circuit for selecting various modes and testing.

Such fuses may be divided into laser fuses and e-fuses depending on a cutting method. Between them, the e-fuses use a method of selectively cutting them by using current. Meanwhile, one of the requirements for improved fuse technology is to reduce the fuse area. In this regard, since a selection element which provides a program current occupies most of the fuse area, it may be required a technique for lowering program current affecting the size of the selection element to thereby reduce the fuse area.

SUMMARY

Various embodiments are directed to an e-fuse for use in a semiconductor device capable of being blown with low program current, thereby improving performance and reducing a fuse area.

In an embodiment, an e-fuse for use in a semiconductor device may include: first and second electrodes; a gate metal coupling the first and second electrodes with each other; a first oxide layer formed under the gate metal; and a gate oxide layer formed between a bottom end of the gate metal and a top end of the first oxide layer.

In an embodiment, an e-fuse for use in a semiconductor device may include: a first gate metal extending from a first electrode; a second gate metal extending from a second electrode to be contacted with the first gate metal; a first oxide layer formed under the first and second gate metals; and a gate oxide layer formed between bottom ends of the first and second gate metals and a top end of the first oxide layer.

In an embodiment, a semiconductor device comprising at least one e-fuse, the e-fuse comprising: first and second electrodes; a gate metal coupling the first and second electrodes with each other; a first oxide layer formed under the gate metal; and a gate oxide layer formed between a bottom end of the gate metal and a top end of the first oxide layer.

According to the embodiments, since the oxide layer is filled under a gate metal to reduce or prevent heat loss, the gate metal may be blown with low program current.

Further, since the gate metal may be blown with low program current, it is possible to reduce an area per bit of an e-fuse.

These and other features and advantages of the present invention will become apparent to those with ordinary skill in the art to which the present invention belongs from the following description in conjunction with the accompanying drawings.

DETAILED DESCRIPTION

Figure 1:
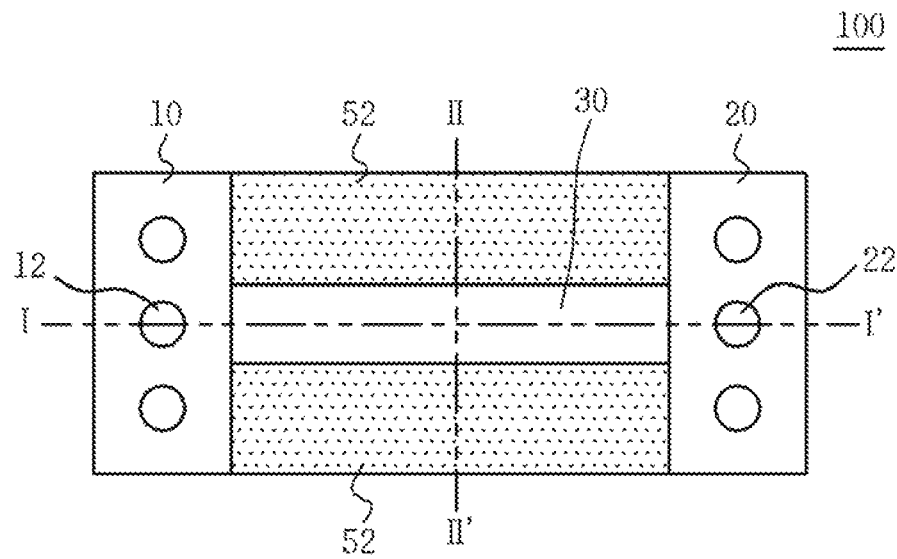
FIG. 1 is a top view to assist in the explanation of an E-fuse for use in a semiconductor device, in accordance with a first embodiment of the present disclosure.

Hereinafter, various embodiments will be described in detail with reference to the accompanying drawings to the extent that a person skilled in the art to which the embodiments pertain may easily practice the embodiments. Among the reference numerals presented in the drawings, like reference numerals denote like members.

In describing the present disclosure, when it is determined that the detailed description of the known related art may obscure the gist of the present disclosure, the detailed description thereof will be omitted.

Although the terms such as first and second may be used to describe various components, the components are not limited by the terms, and the terms are used only to distinguish components from other components.

The terminology used herein is for the purpose of describing particular embodiments only and is not intended to be limiting of the present invention. As used herein, singular forms are intended to include the plural forms as well, unless the context clearly indicates otherwise.

It will be further understood that the terms "comprises", "comprising", "includes" and "including" when used in this specification, specify the presence of the stated elements and do not preclude the presence or addition of one or more other elements. As used herein, the term "and/or" includes any and all combinations of one or more of the associated listed items.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated In the following embodiments, an n-type metal may be defined as a metal which is used in an NMOS (n-type metal oxide semiconductor) transistor, and a p-type metal may be defined as a metal which is used in a PMOS (p-type metal oxide semiconductor) transistor.

FIG. 1 is a top view to assist in the explanation of an E-fuse for use in a semiconductor device, in accordance with a first embodiment of the present disclosure.

Referring to FIG. 1, an e-fuse 100 of a semiconductor device includes first and second electrodes 10 and 20, a gate metal 30, and a first oxide layer 52.

The first electrode 10 may be referred to as a cathode, and the second electrode 20 may be referred to as an anode. Contacts 12 and 22 for applying a program voltage in the program of the e-fuse 100 may be formed on the first and second electrodes 10 and 20. Programming the e-fuse includes flowing a program current through the gate metal 30 by applying a program voltage to any one of the first and second electrodes 10 and 20 and applying a ground voltage to any one of the other of the first and second electrodes 10 and 20.

The gate metal 30 has a structure which electrically couples the first and second electrodes 10 and 20, is disposed between the first and second electrodes 10 and 20, and is formed of a material capable of being electrically programmed. For instance, the gate metal 30 may be formed of an n-type or a p-type metal which is used in an NMOS or a PMOS transistor. The gate metal 30 may be formed of a metallic material such as Al or may be formed of layers of TiN, Ti, Al and AlTiO. The gate metal 30 may be formed integrally with the first electrode 10 and the second electrode 20.

The gate metal 30 may have an elongated bar shape extending in a first direction I-I'. The first and second electrodes also may each have an elongated bar shape extending in a second direction II-II'. The second direction II-II' may be perpendicular to the first direction I-I'.

The first oxide layer 52 is formed under the gate metal 30 with a gate oxide layer 60 disposed therebetween. The first oxide layer 52 may also be formed under the first and second electrodes 10 and 20 with the gate oxide layer 60 disposed therebetween. The first oxide layer 52 may reduce or prevent heat loss during the programming of the e-fuse 100.

The gate oxide layer 60 (see FIG. 2) may be formed between the gate metal 30 and the first oxide layer 52, and between the first and second electrodes and the first oxide layer 52. The gate oxide layer 60 may break down during the programming of the e-fuse 100.

As such, the e-fuse 100 of a semiconductor device may include the first and second electrodes 10 and 20 for applying the program voltage, the gate metal 30 which electrically couples the first and second electrodes 10 and 20, the gate oxide layer 60, and the first oxide layer 52 which is formed under the first electrode 10 to under the second electrode 20.

In the e-fuse 100 of a semiconductor device configured as mentioned above, when program voltage is applied to the second electrode 20 and the ground voltage is applied to the first electrode 10, the program current flows through the gate metal 30 due to the potential difference of the first and second electrodes 10 and 20, and electro-migration, thermo-migration and melting phenomena are induced in the gate metal 30 by the program current. As a result, a void may be formed in the gate metal 30 and resistance may increase.

Also, in the e-fuse 100 of a semiconductor device, the gate metal 30 and a gate oxide layer 60 (see FIG. 2) react with each other or the dielectric constant characteristic of the gate oxide layer 60 may change due to the high temperature of the gate metal 30 in the programming. Through this, the metal current of the e-fuse 100 may change significantly before and after the programming.

A driving force by the electro-migration induced in the gate metal 30 may be changed by changing the sectional area of the gate metal 30. While it is illustrated in FIG. 1 that the gate metal 30 has the same sectional area between the first and second electrodes 10 and 20 and extends in one direction, this is only for the sake of convenience in explanation, and it is to be noted that the embodiment is not limited thereto. The gate metal 30 may include a bent portion in correspondence to the positions of the first and second electrodes 10 and 20, and may be formed to have a different sectional area. The bent portion or the variable sectional area may have an advantage of enabling the blowing of the gate metal 30 by a lower program current.

When program current flows through the gate metal 30, Joule's heat may be generated in the gate metal 30. The Joule's heat induced by the program current may have a nonuniform temperature distribution in the gate metal 30. The non-uniform temperature distribution in the gate metal 30 may have a highest temperature at the center portion of the gate metal 30. The nonuniform temperature distribution may induce the thermo-migration of atoms in the gate metal 30. The thermo-migration may include a thermo-migration in which atoms migrate in an anode direction from the center portion of the gate metal 30 and a thermo-migration in which atoms migrate in a cathode direction from the center portion of the gate metal 30.

In this way, when program current flows through the gate metal 30, electro-migration, thermo-migration and melting phenomena are induced in the gate metal 30, and a driving force by the electro-migration, thermo-migration and melting phenomena blows the gate metal 30. If the gate metal 30 is blown, the metal current of the e-fuse 100 may change significantly before and after the programming. Also, since the first oxide layer 52 is filled under the gate metal 30 to reduce or prevent heat loss, it is possible to blow the gate metal 30 with low program current. Therefore, since the gate metal 30 is blown with low program current, it is possible to reduce an area per bit of the e-fuse 100.

Figure 2:
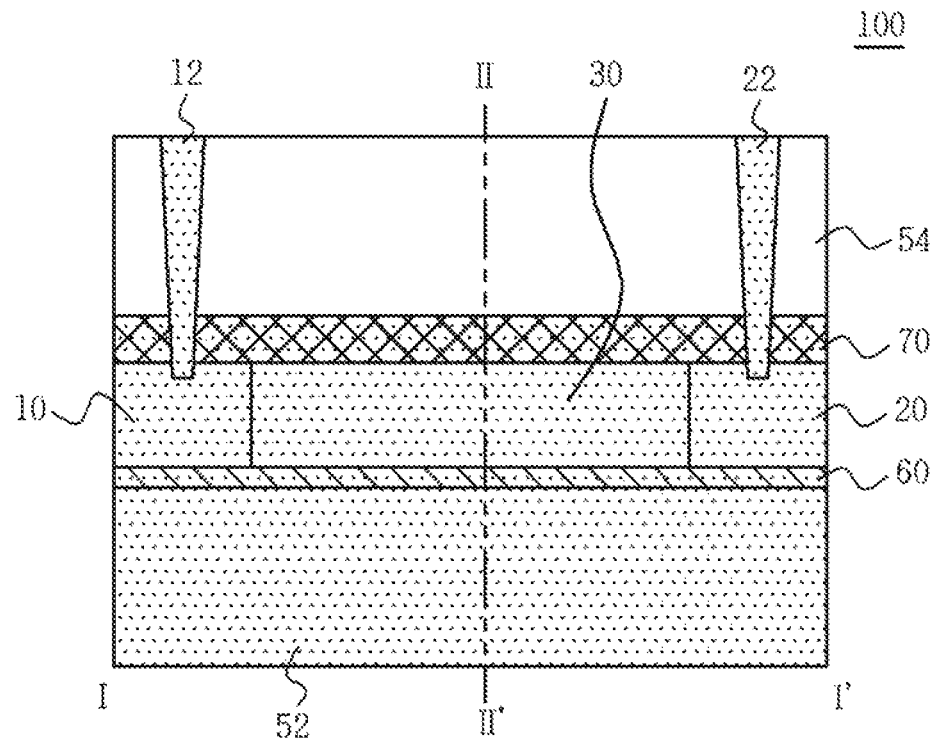
FIG. 2 is a cross-sectional view taken along the line I-I' of FIG. 1.

A silicon nitride layer 70 and a second oxide layer 54 shown in FIG. 2 are not shown in the top view of FIG. 1 to facilitate the understanding of the structure of the present embodiment. As shown in FIG. 2, the silicon nitride layer 70 may be formed on the gate metal 30 and the first and second electrodes 10 and 20, and the second oxide layer 54 may be formed on the silicon nitride layer 70 and the first oxide layer 52.

FIG. 2 is a cross-sectional view taken along the line I-I' of FIG. 1.

Referring to FIG. 2, the first oxide layer 52 is formed under the gate metal 30, and the gate oxide layer 60 is formed between the gate metal 30 and the first oxide layer 52. The first oxide layer 52 is used for reducing or preventing heat loss in the programming of the e-fuse 100. The gate oxide layer 60 may react with the gate metal 30 or be changed in its dielectric constant characteristic due to a high temperature in the programming. For instance, the gate oxide layer 60 may be formed of $HfO_2$.

The silicon nitride layer 70 may be formed on the gate metal 30, and the second oxide layer 54 is formed on the silicon nitride layer 70. For instance, the silicon nitride layer 70 may be formed of SiN or SiCN.

Figure 3:
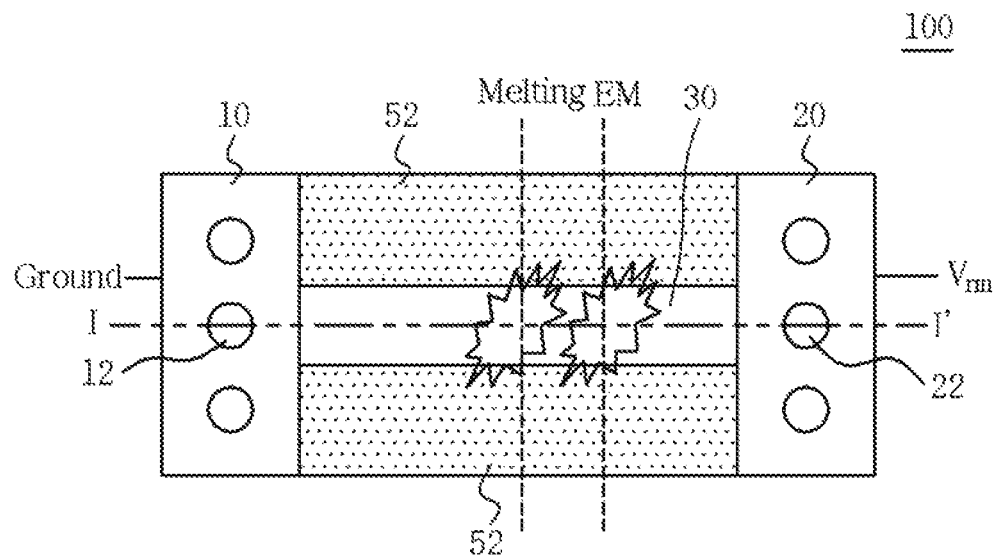
FIG. 3 is a view to assist in the explanation of the change of metal current when programming the e-fuse.
Figure 4:
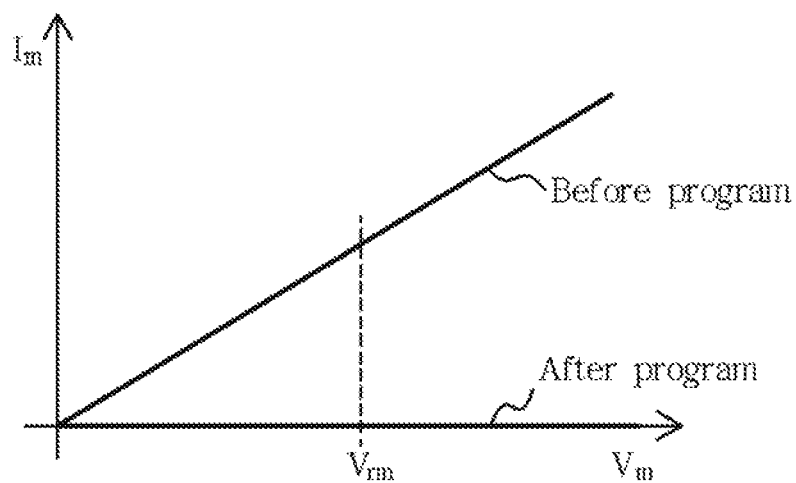
FIG. 4 is a graph to assist in the explanation of the change of the metal current before and after program.

FIG. 3 is a view to assist in the explanation of the change of metal current when programming the e-fuse. FIG. 4 is a graph to assist in the explanation of the change of the metal current before and after program.

Referring to FIGS. 3 and 4, in the e-fuse 100 of a semiconductor device, when program voltage is applied to the second electrode 20 and the ground voltage is applied to the first electrode 10, program current flows through the gate metal 30 due to the potential difference of the first and second electrodes 10 and 20, and electro-migration, thermo-migration and melting phenomena are induced in the gate metal 30 by the program current. As a result, a void may be formed in the gate metal 30 and resistance may increase.

In the case where fusing proceeds in a state where a current density is relatively high in the programming of the e-fuse 100, a void may be formed in the center of the gate metal 30 as the gate metal 30 is melted at the center thereof having a highest temperature. In the case where fusing proceeds in a state where a current density is relatively low in the programming of the e-fuse 100, a void may be formed in a portion of the gate metal 30 close to the second electrode 20 due to electro-migration and thermo-migration phenomena.

In this regard, the metal current of the e-fuse 100 may change significantly before and after the programming. If a void is formed in the gate metal 30, gate resistance may increase and thus a voltage actually applied to the gate may decrease, and the metal current may decrease. Moreover, as the characteristics of the gate metal 30 and the gate oxide layer 60 are changed by the heat generated in the programming of the gate metal 30, the metal current may change.

Figure 5:
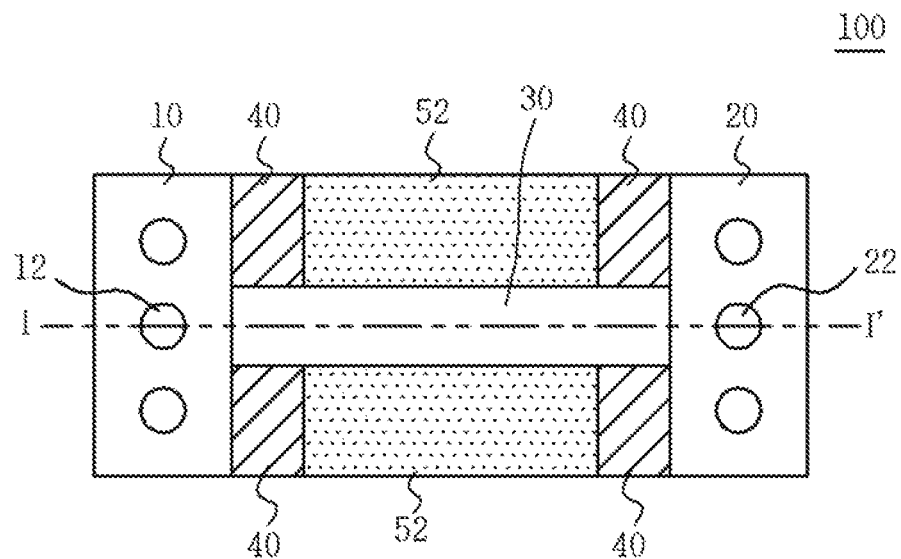
FIG. 5 is a top view to assist in the explanation of an E-fuse for use in a semiconductor device, in accordance with a second embodiment of the present disclosure.
Figure 6:
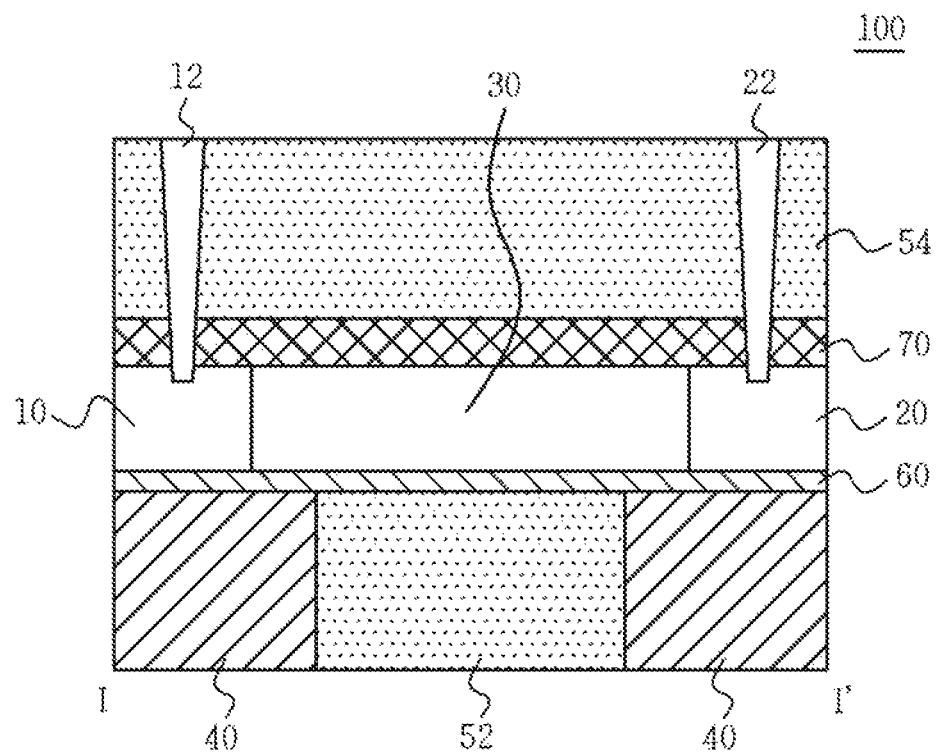
FIG. 6 is a cross-sectional view taken along the line I-I' of FIG. 5.

FIG. 5 is a top view of an e-fuse 100 of a semiconductor device, in accordance with a second embodiment of the present disclosure. FIG. 6 is a cross-sectional view taken along the line I-I' of FIG. 5. A silicon nitride layer 70 and a second oxide layer 54 shown in FIG. 6 are not shown in the top view of FIG. 5 to facilitate the understanding of the structure of the present embodiment. As shown in FIG. 6, the silicon nitride layer 70 may be formed on the gate metal 30 and first and second electrodes 10 and 20, and the second oxide layer 54 may be formed on the silicon nitride layer 70, the semiconductor layer 40 and the first oxide layer 52.

Referring to FIGS. 5 and 6, the e-fuse 100 of a semiconductor device may include the first and second electrodes 10 and 20, the gate metal 30, the semiconductor layer 40, the gate oxide layer 60, and the first oxide layer 52. The descriptions made above with reference to FIG. 1 will replace descriptions for components the same as those of the first embodiment.

The first oxide layer 52 is formed under the gate metal 30 with the gate oxide layer disposed therebetween. The first oxide layer 52 has a smaller length than the metal gate 30 in the first direction I-I', and is positioned in correspondence to the center portion of the gate metal 30. Hence, side portions of the metal gate 30 (also referred to herein after as the sides of the metal gate 30) extend further in the first direction I-I' than the first oxide layer 52. The first oxide layer 52 may reduce or prevent heat loss in the programming of the e-fuse 100.

The semiconductor layer 40 is formed under the gate metal 30 and on both sides of the first oxide layer 52, with the gate oxide layer 60 disposed therebetween. Hence the semiconductor layer overlaps with the first and second electrodes 10 and 20 and the sides of the metal gate 30.

The gate oxide layer 60 may be formed between the bottom end of the gate metal 30 and the top end of the first oxide layer 52, and also between the top end of the semiconductor layer 40 and the bottom ends of the first and second electrodes. The gate oxide layer 60 may react with the gate metal 30 or be changed in its dielectric constant characteristic due to a high temperature in the programming, and thereby, may break down. For instance, the gate oxide layer 60 may be formed of $HfO_2$.

The silicon nitride layer 70 may be formed on the gate metal 30, and the second oxide layer 54 may be formed on the silicon nitride layer 70. For instance, the silicon nitride layer 70 may be formed of SiN or SiCN.

The e-fuse 100 may include the first and second electrodes 10 and 20 for applying a program voltage, the gate metal 30 which electrically couples the first and second electrodes 10 and 20, the first oxide layer 52 which is formed under the gate metal 30 in correspondence to the center portion of the gate metal 30, and the semiconductor layer 40 which is formed on both sides of the first oxide layer 52. The e-fuse 100 may also include a gate oxide layer 60 disposed between the first oxide layer 52 and the metal gate 30, and between the semiconductor layer 40 and the first and second electrodes 10 and 20 and the sides of the metal gate 30. In the case of programming the gate metal 30 by forming an oxide under the center portion of the gate metal 30 corresponding to a fuse link portion, forming portions close to a cathode electrode and an anode electrode by Si and applying voltages to the cathode electrode and the anode electrode, the center portion of the gate metal 30 retains a high temperature due to the presence of the oxide having low heat conductivity, and the portions close to the cathode and anode electrodes retains a low temperature due to the presence of Si having high heat conductivity. As a consequence, as a temperature gradient is maximized and thus an atomic flux divergence is maximized, the e-fuse 100 according to the present embodiment may be easily cut.

In the e-fuse 100 configured as mentioned above, when a program voltage is applied to the second electrode 20 and a ground voltage is applied to the first electrode 10, program current flows through the gate metal 30 due to the potential difference of the first and second electrodes 10 and 20, and electro-migration and thermo-migration phenomena are induced in the gate metal 30 by the program current. As a result, a void may be formed in the gate metal 30 and resistance may increase.

Also, in the e-fuse 100 for a semiconductor device, the gate metal 30 and the gate oxide layer 60 may react with each other or the dielectric constant characteristic of the gate oxide layer 60 may change due to the high temperature of the gate metal 30 in the programming. Through this, the metal current of the e-fuse 100 may change significantly before and after the programming.

In this way, when program current flows through the gate metal 30, electro-migration, thermo-migration and melting phenomena are induced in the gate metal 30, and a driving force by the electro-migration and thermo-migration phenomena blows the gate metal 30. If the gate metal 30 is blown, the metal current of the e-fuse 100 may change significantly before and after the programming of the e-fuse 100.

According to the present embodiment, since the first oxide layer 52 is filled under the gate metal 30 to reduce or prevent heat loss, it is possible to blow the gate metal 30 with a low program current. Therefore, since the gate metal 30 is blown with low program current, it is possible to reduce the area per bit of the e-fuse 100.

Figure 7:
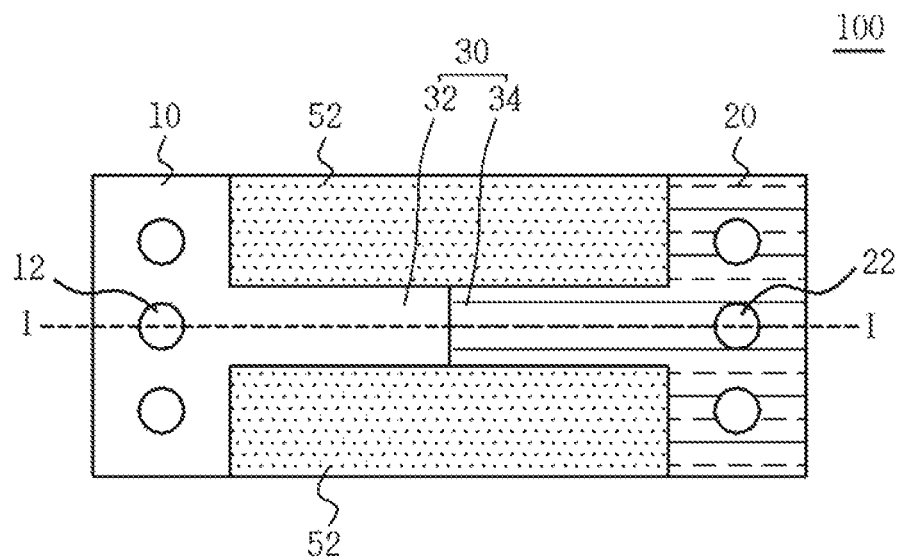
FIG. 7 is a top view to assist in the explanation of an e-fuse for use in a semiconductor device, in accordance with a third embodiment of the present disclosure.
Figure 8:
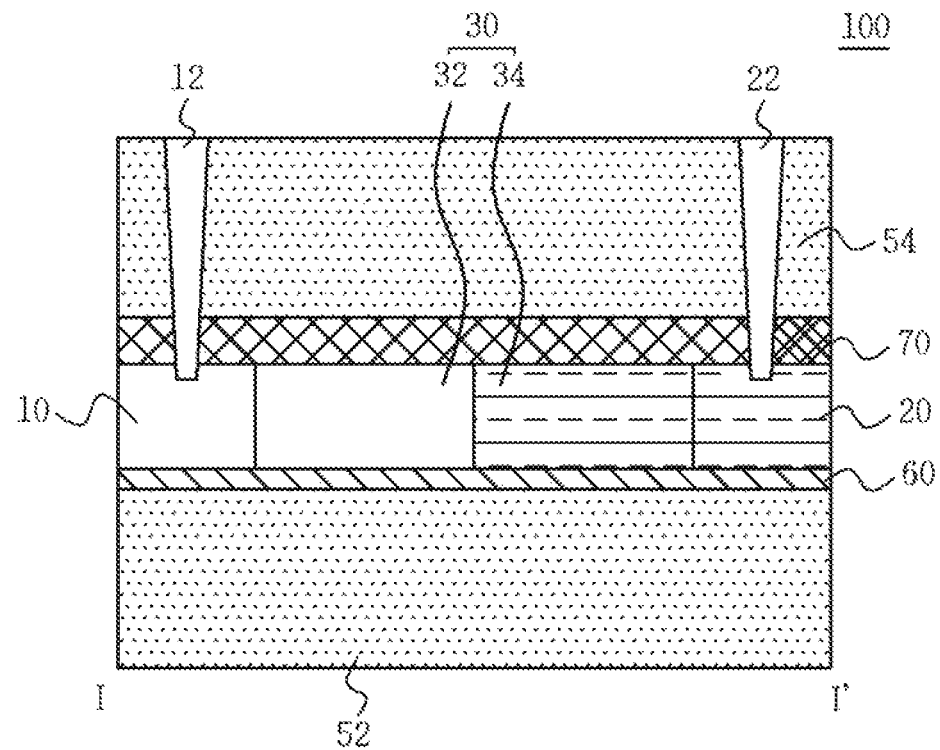
FIG. 8 is a cross-sectional view taken along the line I-I' of FIG. 7.

FIG. 7 is a top view of an e-fuse 100 for a semiconductor device, in accordance with a third embodiment of the present disclosure. FIG. 8 is a cross-sectional view taken along the line I-I' of FIG. 7. A silicon nitride layer 70 and a second oxide layer 54 shown in FIG. 8 are not shown in the top view of FIG. 7 to facilitate the understanding of the structure of the present embodiment. As shown in FIG. 8, the silicon nitride layer 70 may be formed on a gate metal 30 and first and second electrodes 10 and 20, and the second oxide vi layer 54 may be formed on the silicon nitride layer 70 and a first oxide layer 52.

Referring to FIGS. 7 and 8, the e-fuse 100 for a semiconductor device may include the first and second electrodes 10 and 20, first and second gate metals 32 and 34, and the first oxide layer 52. The e-fuse 100 may also include gate oxide layer 60.

The first and second gate metals 32 and 34 have a structure which electrically couples the first and second electrodes 10 and 20, are disposed between the first and second electrodes 10 and 20, and are formed of materials capable of being electrically programmed.

The first and second gate metals 32 and 34 may be formed of different metals or may be formed of one or more different metallic materials. For instance, the first gate metal 32 may be formed of a metallic material such as Al, and the second gate metal 34 may be formed of a layer of TiN, Ti, Al and AlTiO or a combination thereof. Alternatively, the first and second gate metals 32 and 34 may be formed of a layer of TiN, Ti, Al and AlTiO or a combination thereof provided that the first and second metal gates 32 and 34 have different specific gravities. The first gate metal 32 may be formed integrally with the first electrode 10, and the second gate metal 34 may be formed integrally with the second electrode 20. The first and second metal gates 32 and 34 may be electrically coupled. For example, one end of the first metal gate coupled to one end of the second metal gate 34, or alternatively, the first and second gate metals 32 and 34 may partially overlap while contacting with each other. The extent of the overlap may differ by design.

The first oxide layer 52 is formed under the first and second gate metals 32 and 34 and under the first and second electrodes 10 and 20. The first oxide layer 52 may reduce or prevent heat loss in the programming of the e-fuse 100.

The gate oxide layer 60 may be formed between the bottom end of the gate metal 30 and the top end of the first oxide layer 52. The gate oxide layer may also be formed between the bottom ends of the first and second electrodes 10 and 20 and the top end of the first oxide layer 52.

The gate oxide layer 60 may react with the gate metal 30 or be changed in its dielectric constant characteristic due to a high temperature in the programming of the e-fuse 100, and thereby, may break down.

The e-fuse 100 for a semiconductor device according to an embodiment, may include the first and second electrodes 10 and 20 for applying a program voltage, the first gate metal 32 which extends from the first electrode 10, the second gate metal 34 which extends from the second electrode 20 to be brought into contact with the first gate metal 32, and the first oxide layer 52 which is formed from under the first electrode 10 to under the second electrode 20. The e-fuse may further include, the gate oxide layer 60 disposed between the first oxide layer 52 and the gate metal 30 and between the first oxide layer 52 and the first and second electrodes 10 and 20.

In the e-fuse 100 for a semiconductor device configured as mentioned above, the first oxide layer 52 is filled under the gate metal 30 to prevent heat loss, hence, it is possible to blow the gate metal 30 with a low program current. Therefore, since the gate metal 30 can be blown with a low program current, it is possible to reduce the area per bit of the e-fuse 100.

Figure 9:
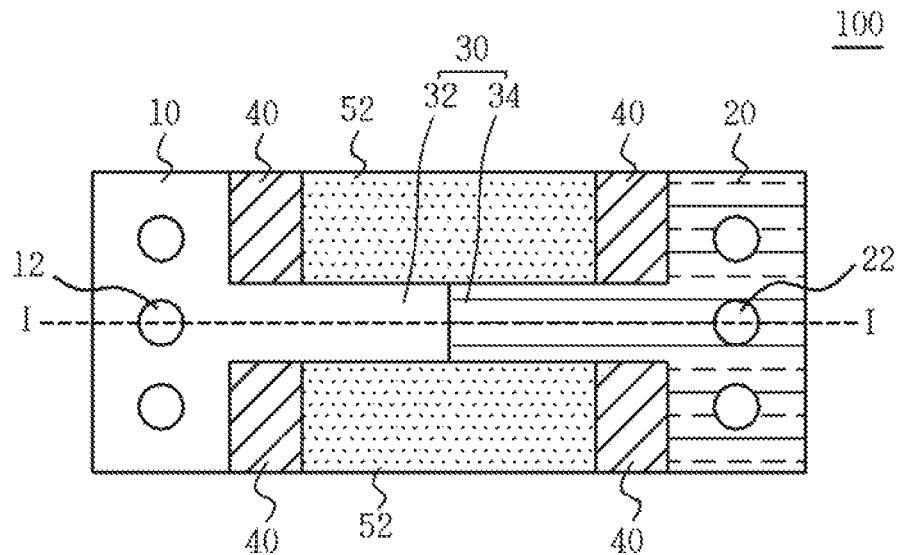
FIG. 9 is a top view to assist in the explanation of an e-fuse for use in a semiconductor device, in accordance with a fourth embodiment of the present disclosure.
Figure 10:
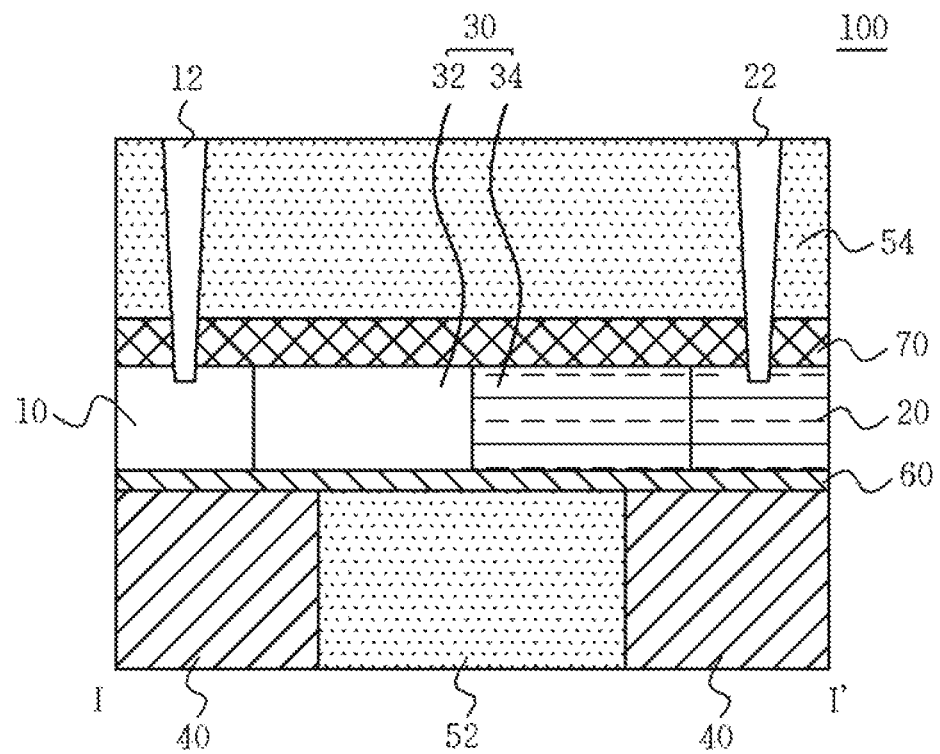
FIG. 10 is a cross-sectional view taken along the line I-I' of FIG. 9.

FIG. 9 is a top view of an e-fuse 100 of a semiconductor device, in accordance with a fourth embodiment of the present disclosure. FIG. 10 is a cross-sectional view taken along the line of FIG. 9. A silicon nitride layer 70 and a second oxide layer 54 shown in FIG. 10 are not shown in the top view of FIG. 9 to facilitate the understanding of the structure of the present embodiment. As shown in FIG. 10, the silicon nitride layer 70 may be formed on gate metal 30 and first and second electrodes 10 and 20, and the second oxide layer 54 may be formed on the silicon nitride layer 70, the semiconductor layer 40 and the first oxide layer 52.

Referring to FIGS. 9 and 10, the e-fuse 100 of a semiconductor device may include the first and second electrodes 10 and 20, first and second gate metals 32 and 34, the semiconductor layer 40, gate oxide layer 60, and the first oxide layer 52. The descriptions made above with reference to FIG. 7 will replace descriptions for components the same as those of the third embodiment.

The first oxide layer 52 is formed under the gate metal 30 with the gate oxide layer 60 disposed therebetween. The first oxide layer 52 may be smaller in length in the first direction I-I' than the gate metal 30 and may be positioned in correspondence to the center portion of the gate metal 30 so that side portions of gate metal 30 (also referred to as the sides of the gate metal 30) may extend further in the first direction I-I' than the first oxide layer 52. The first oxide layer 52 may reduce or prevent heat loss in the programming of the e-fuse 100.

The semiconductor layer 40 is formed under the first and second gate metals 32 and 34 and on both sides of the first oxide layer 52.

The gate oxide layer 60 may be formed between the bottom ends of the gate metal 30 and the first and second electrodes 10 and 20 and the top ends of the first oxide layer 52 and of the semiconductor layer 40. The gate oxide layer 60 may react with the gate metal 30 or be changed in its dielectric constant characteristic due to a high temperature in the programming, and thereby, may break down. For instance, the gate oxide layer 60 may be formed of $HfO_2$.

The silicon nitride layer 70 may be formed on the gate metal 30, and the second oxide layer 54 is formed on the silicon nitride layer 70. For instance, the silicon nitride layer 70 may be formed of SiN or SiCN.

As such, the e-fuse 100 for a semiconductor device may include the first and second electrodes 10 and 20 for applying a program voltage, the first gate metal 32 which extends from the first electrode 10, the second gate metal 34 which extends from the second electrode 20 to be brought into contact with the first gate metal 32, the first oxide layer 52 which is formed under the gate metal 30 in correspondence to the center portion of the gate metal 30, and the semiconductor layer 40 which is formed on both sides of the first oxide layer 52 in correspondence to the bottoms of the first and second electrodes 10 and 20. The e-fuse may further include the gate oxide layer 60.

In the case of programming the gate metal 30 by forming an oxide under the center portion of the gate metal 30 corresponding to a fuse link portion, forming portions close to a cathode electrode and an anode electrode by Si and applying voltages to the cathode electrode and the anode electrode, the center portion of the gate metal 30 retains a high temperature due to the presence of the oxide having low heat conductivity, and the portions close to the cathode and anode electrodes retains a low temperature due to the presence of Si having high heat conductivity. As a consequence, as a temperature gradient is maximized and thus an atomic flux divergence is maximized, the e-fuse 100 according to the present embodiment may be easily cut.

In the e-fuse 100 of a semiconductor device configured as mentioned above, when program voltage is applied to the second electrode 20 and a ground voltage is applied to the first electrode 10, program current flows through the gate metal 30 due to the potential difference of the first and second electrodes 10 and 20, and electro-migration, thermo-migration and melting phenomena are induced in the gate metal 30 by the program current. As a result, a void may be formed in the gate metal 30 and resistance may increase.

Also, in the e-fuse 100 of a semiconductor device, the gate metal 30 and the gate oxide layer 60 may react with each other or the dielectric constant characteristic of the gate oxide layer 60 may change due to the high temperature of the gate metal 30 in the programming. Through this, the metal current of the e-fuse 100 may change significantly before and after the programming.

According to the present embodiment, first oxide layer 52 is filled under the gate metal 30 to reduce or prevent heat loss, thus making it possible to blow the gate metal 30 with a low program current. Therefore, since the gate metal 30 is blown with low program current, it is possible to reduce an area per bit of the e-fuse 100.

Although various embodiments have been described for illustrative purposes, it will be apparent to those skilled in the art that various changes and modifications may be made without departing from the spirit and scope of the invention as defined in the following claims.

What is claimed is:

1. An e-fuse for use in a semiconductor device, comprising:
   first and second electrodes;
   a first gate metal extending from the first electrode by a first length;
   a second gate metal extending from the second electrode by the first length and in contact with the first gate metal;
   a first oxide layer formed under the first and second gate metals, wherein the first oxide layer is formed under a portion where the first and second gate metals are in contact with each other, and wherein the first oxide layer is formed at the same level as a semiconductor layer;
   a gate oxide layer formed between a bottom end of the first and second gate metals and a top end of the first oxide layer;
   the semiconductor layer formed under the first and second gate metals and on both sides of the first oxide layer;
   a silicon nitride layer formed over the first and second gate metals and the first and second electrodes; and
   a second oxide layer formed over the silicon nitride layer, the semiconductor layer, the first oxide layer and on both sides of the first and second gate metals.

2. The e-fuse for use in a semiconductor device according to claim 1, wherein the gate oxide layer is formed under the first and second gate metals and is contact with the top end of the first oxide layer corresponding to a bottom of the first and second gate metals.

3. The e-fuse for use in a semiconductor device according to claim 1, wherein the first gate metal is formed as an n-type metal which is used in an NMOS, and the second gate metal is formed as a p-type metal which is used in a PMOS.

4. An e-fuse for use in a semiconductor device, comprising:
   a first gate metal extending from a first electrode by a first length;
   a second gate metal extending from a second electrode by the first length and in contact with the first gate metal, wherein the first and second gate metals are formed of different metals;
   a first oxide layer formed under the first and second gate metals, wherein the first oxide layer is formed under a portion where the first and second gate metals are in contact with each other, and wherein the first oxide layer is formed at the same level as a semiconductor layer; and
   a gate oxide layer formed between bottom ends of the first and second gate metals and a top end of the first oxide layer;
   the semiconductor layer formed under the first and second gate metals and on both sides of the first oxide layer;
   a silicon nitride layer formed over the gate metal and the first and second electrodes; and
   a second oxide layer formed over the silicon nitride layer, the semiconductor layer, the first oxide layer and on both sides of the gate metal.

5. The e-fuse for use in a semiconductor device according to claim 4, wherein the first gate metal is formed as an n-type metal which is used in an NMOS, and the second gate metal is formed as a p-type metal which is used in a PMOS.

6. The e-fuse for use in a semiconductor device according to claim 4, wherein the gate oxide layer is formed under the first and second gate metals and is brought into contact with the top end of the first oxide layer corresponding to bottoms of the first and second gate metals.

7. A semiconductor device comprising at least one e-fuse, the e-fuse comprising:
   first and second electrodes;
   a first gate metal extending from the first electrode by a first length;
   a second gate metal extending from the second electrode by the first length and in contact with the first gate metal, wherein the first and second gate metals are formed of different metals;
   a first oxide layer formed under the first and second gate metals, wherein the first oxide layer is formed under a portion where the first and second gate metals are in contact with each other, and wherein the first oxide layer is formed at the same level as a semiconductor layer; and
   a gate oxide layer formed between a bottom end of the gate metal and a top end of the first oxide layer;
   the semiconductor layer formed under the first and second gate metals and on both sides of the first oxide layer;
   a silicon nitride layer formed over the gate metal and the first and second electrodes; and
   a second oxide layer formed over the silicon nitride layer, the semiconductor layer, the first oxide layer and on both sides of the gate metal.

\* \* \* \* \*